United States Patent
Flamm et al.

(10) Patent No.: US 10,130,015 B2
(45) Date of Patent: Nov. 13, 2018

(54) ELECTRONIC CIRCUIT UNIT

(71) Applicant: Robert Bosch GmbH, Stuttgart (DE)

(72) Inventors: Gunter Flamm, Sonnenbuehl (DE); Heiner Jacobs, Baden-Baden (DE); Reiner Schuetz, Ditzingen (DE); Ahmet Kuecuek, Nuertingen (DE); Hans-Peter Schroeter, Rottenburg (DE); Michael Maercker, Stuttgart (DE); Moritz Pfeiffer, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/371,398

(22) Filed: Dec. 7, 2016

(65) Prior Publication Data

US 2017/0164509 A1   Jun. 8, 2017

(30) Foreign Application Priority Data

Dec. 7, 2015  (DE) ........................ 10 2015 224 422

(51) Int. Cl.
| | |
|---|---|
| H05K 7/00 | (2006.01) |
| H05K 7/20 | (2006.01) |
| H02M 7/00 | (2006.01) |
| H05K 7/14 | (2006.01) |

(52) U.S. Cl.
CPC ............ *H05K 7/209* (2013.01); *H02M 7/003* (2013.01); *H05K 7/1432* (2013.01); *H01L 2224/48472* (2013.01)

(58) Field of Classification Search
CPC ... H05K 1/11; H05K 1/14; H05K 7/00; H05K 7/18; H05K 7/20; H05K 7/209; H01L 23/28; H01L 23/34; H01L 23/48; H01L 23/52

USPC ........ 174/252, 521, 531, 532; 361/719, 728, 361/729, 752, 792, 796; 363/144, 147; 257/666, 678, 681, 687, 712, 723
See application file for complete search history.

(56) References Cited

U.S. PATENT DOCUMENTS

| | | | | |
|---|---|---|---|---|
| 4,725,692 A * | 2/1988 | Ishii | .................. | H01L 23/49541 174/531 |
| 5,159,433 A * | 10/1992 | Kazami | ............. | H01L 21/67121 257/681 |
| 5,604,674 A * | 2/1997 | Terasawa | ............ | H01L 25/0655 257/E25.012 |
| 5,646,445 A * | 7/1997 | Masumoto | .............. | H01L 23/24 257/703 |
| 6,144,571 A * | 11/2000 | Sasaki | ................... | H01L 25/162 257/687 |
| 6,972,479 B2 * | 12/2005 | Chen | ................. | H01L 23/49861 257/666 |
| 7,751,194 B2 * | 7/2010 | Sakamoto | .......... | H05K 7/20009 165/185 |

(Continued)

*Primary Examiner* — Xiaoliang Chen
(74) *Attorney, Agent, or Firm* — Michael Best & Friedrich LLP

(57) ABSTRACT

An electronic circuit unit (1) comprising at least one electrical or electronic device (8) with at least one terminal contact (101), the at least one terminal contact (101) being connected in an electrically conducting manner to at least one terminal pad (100), at least one terminal contact (101) and at least one terminal pad (100) are surrounded in the region of the electrical point of contact by an electrically insulating compound (9), the electrical or electronic device (8) being arranged outside the electrically insulating compound (9).

15 Claims, 3 Drawing Sheets

(56) References Cited

U.S. PATENT DOCUMENTS

| | | | |
|---|---|---|---|
| 7,782,628 B2* | 8/2010 | Sakamoto | H05K 1/144 174/521 |
| 8,102,655 B2* | 1/2012 | Sakamoto | H05K 1/144 174/520 |
| 8,102,670 B2* | 1/2012 | Sakamoto | H05K 1/144 361/792 |
| 8,107,255 B2* | 1/2012 | Sakamoto | H05K 1/144 361/695 |
| 8,169,784 B2* | 5/2012 | Sakamoto | H01L 25/162 361/729 |
| 8,842,438 B2* | 9/2014 | Kim | H01L 23/3121 257/678 |
| 2007/0109715 A1 | 5/2007 | Azuma et al. | |
| 2007/0125449 A1* | 6/2007 | Kajiwara | B23K 35/025 148/23 |
| 2010/0013085 A1* | 1/2010 | Oi | H01L 23/3121 257/693 |

* cited by examiner

ELECTRONIC CIRCUIT UNIT

BACKGROUND OF THE INVENTION

The invention relates to an electronic circuit unit, in particular a circuit unit that serves as an inverter for an electrical machine or as a converter.

In hybrid vehicles or electric vehicles, inverter structures and converter structures are used, with commutating circuits comprising DC link capacitors and half-bridges, which are for example formed in power modules. For example, for operating an electrical machine, inverters that provide the phase currents for the electrical machine are used. The inverters and converters comprise for example power modules and at least one DC link capacitor, which provides the electrical energy in a short time. The power modules may for example comprise a carrier substrate with interconnects, arranged on which there are for example power semiconductors, which together with the carrier substrate form an electronics assembly. It is known that terminal contacts of the DC link capacitor are connected in an electrically conducting manner to the power modules. For this purpose, contact elements led out from the power module, which electrically contact the electronics assembly, are connected to the terminal contacts of the DC link capacitor. The electronics assembly may be encapsulated by an electrically insulating compound, out of which the contact elements that electrically contact the electronics assembly are led and are connected outside the electrically insulating compound to the terminal elements.

US 2007 0109715 A1 shows such a DC link capacitor that is connected in an electrically conducting manner to power modules. Electronics assemblies of the power modules are in this case arranged in racks, and contact elements that electrically contact the electronics assembly are led out from the rack for further contacting and are then screwed to the terminal contacts of the DC link capacitor and thereby provide an electrically conducting contact.

SUMMARY OF THE INVENTION

According to the invention, an electronic circuit unit, in particular a circuit unit that serves as an inverter for an electrical machine or as a converter, is proposed. The electronic circuit unit comprises at least one electronics unit, in particular a power electronics unit, the electronics unit comprising at least one carrier substrate and at least one electrical and/or electronic component arranged on the carrier substrate, the carrier substrate being arranged on an upper side of a heat sink and at least one terminal pad being formed on the carrier substrate, on a substrate upper side of the carrier substrate that is facing away from the upper side of the heat sink. The electronic circuit unit also comprises at least one electrical or electronic device with at least one terminal contact, the at least one terminal contact being connected in an electrically conducting manner to the at least one terminal pad. According to the invention, the at least one terminal contact and the at least one terminal pad are surrounded in the region of the electrical point of contact by an electrically insulating compound, the electrical or electronic device being arranged outside the electrically insulating compound.

In comparison with the prior art, the electronic circuit unit of the invention has the advantage that the at least one terminal contact of the electrical or electronic device of the electronic circuit unit is in direct electrical contact with the at least one terminal pad of the carrier substrate of the electronics unit of the electronic circuit unit and the terminal contact and the terminal pad are encapsulated in the region of the point of electrical contact by an electrically insulating compound. This dispenses with further contact elements for the electrical contacting, such as are for example arranged between the terminal pad and the terminal contacts in the prior art, and the electronic circuit unit can consequently be designed in an advantageously compact, simple and inexpensive manner. The electrically insulating compound allows the terminal contacts and the contact pads to be electrically insulated from other electrical and/or electronic components or else from the surrounding vicinity.

In a particularly advantageous exemplary embodiment, the electronics unit is completely surrounded by the electrically insulating compound on the upper side of the heat sink and the at least one terminal contact of the electrical or electronic device is led into the electrically insulating compound, so that a first region of the terminal contact, which is facing the electrical or electronic device, is arranged outside the electrically insulating compound and a second region of the terminal contact, in which the terminal contact is in electrically conducting contact with the terminal pad, is arranged inside the electrically insulating compound. In this way, the terminal contact of the electrical or electronic device is advantageously electrically insulated in the second region of the terminal contact, in which it is arranged inside the electrically insulating compound. Thus, smaller creepage current distances or air-gap distances have to be maintained in this region, and consequently the electronic circuit unit can for example also be designed in a particularly advantageously compact manner. Furthermore, the electronics assembly can also be advantageously protected by the electrically insulating compound from external effects, for example from mechanical loads or from media surrounding the electronic circuit unit.

If at least two terminal contacts, comprising at least one first terminal contact and at least one second terminal contact, are formed on the electrical or electronic device and at least two terminal pads, comprising at least one first terminal pad and at least one second terminal pad, are formed on the substrate upper side of the carrier substrate, the first terminal contact can be formed at least partially two-dimensionally as a first conductor bar and the second terminal contact can be formed at least partially as a two-dimensional second conductor bar, the first terminal contact and the second terminal contact being arranged in relation to one another in such a way that a first large area of the first conductor bar lies opposite a second large area of the second conductor bar, so that at least a gap is formed between the first conductor bar and the second conductor bar. Conductor bars formed and arranged in such a way advantageously reduce the inductance in the region in which the terminal contacts are led into the electrically insulating compound, and consequently also advantageously reduce the overall inductance of the electronic circuit unit. Consequently, losses and heat generation are for example also advantageously reduced.

Particularly advantageously, an insulating element, which electrically insulates the first conductor bar from the second conductor bar, is arranged in the gap between the first conductor bar and the second conductor bar, the insulating element being two-dimensionally formed and led together with the first terminal contact and the second terminal contact into the electrically insulating compound. An insulating element arranged and formed in such a way allows the terminal contacts of the electrical or electronic device to be advantageously insulated from one another up to in the electrically insulating compound. Consequently, the terminal contacts can for example be advantageously led such that they are parallel to one another and insulated from one another up to in the electrically insulating compound surrounding the electronics unit, and consequently the overall inductance of the circuit unit can in turn be reduced by the contacts being led in parallel.

It proves to be particularly advantageous if the insulating element arranged in the gap is adhesively attached in a material-bonding manner to the first large area of the first conductor bar and/or to the second large area of the second conductor bar. This allows the insulating element to be advantageously arranged securely and in a fixed position in the circuit unit and the electronics unit consequently to be advantageously produced in a simple and low-cost manner.

Advantageously, the first conductor bar of the first terminal contact and the second conductor bar of the second terminal contact may be arranged at least in certain regions perpendicularly to the carrier substrate. This allows the electronic circuit unit to be advantageously constructed in a space-saving manner and the terminal elements to be advantageously led into the electrically insulating compound surrounding the electronics unit.

In a particularly advantageous exemplary embodiment, at least one first terminal web is formed on the first conductor bar and at least one second terminal web is formed on the second conductor bar, the electrically conducting connection between the first terminal contact and first terminal pad being established by way of the first terminal web and the electrically conducting connection between the second terminal contact and the second terminal pad being established by way of the second terminal web, a width of the first terminal web being less than a width of the first conductor bar and a width of the second terminal web being less than a width of the second conductor bar. In this way it is advantageously possible to compensate for a difference in size between the electrical or electronic device, such as for example a DC link capacitor with the terminal contacts formed for example as wide conductor bars, and the terminal pads of the carrier substrate, formed for example on interconnects of the carrier substrate.

It may prove to be particularly advantageous if the first terminal web of the first terminal contact and/or the second terminal web of the second terminal contact have an L-shaped profile, a first region of the first terminal web being formed in a plane of extent of the first conductor bar and a second region of the first terminal web being arranged parallel to the carrier substrate and/or a first region of the second terminal web being formed in a plane of extent of the second conductor bar and a second region of the second terminal web being arranged parallel to the carrier substrate. With conductor bars arranged at least partially perpendicularly to the carrier substrate, terminal webs formed in such a way allow advantageous stable mechanical connections between the electronics unit and the terminal contacts of the electrical or electronic device to be established by the second regions of the conductor bars, which are arranged parallel to the carrier substrate, and allow a wide contact area to be formed between the terminal pads and the terminal elements, which for example makes a particularly stable and simple connection of the terminal contacts to the terminal pads possible, for example by welding, soldering, a press contact, a press-fit contact, a purely pressure contact or other suitable contacting techniques.

If the first terminal contact and/or the second terminal contact are formed symmetrically with respect to a plane of symmetry running perpendicularly to the carrier substrate, the overall inductance of the electronic circuit unit is advantageously reduced, and consequently losses and heat generation are also advantageously prevented. In addition, with terminal contacts formed in this way, the electronics unit can for example also be advantageously designed symmetrically, and thus the overall inductance of the electronic circuit unit and associated losses can be further minimized.

In a particularly advantageous exemplary embodiment, the first terminal contact is welded to the first terminal pad and/or the second terminal contact is welded to the second terminal pad. Apart from a stable electrically conducting connection between the terminal contacts and the terminal pads, this also allows an advantageously fixed and stable mechanical connection to be established.

If the electrically insulating compound is formed as a potting compound and the electronics unit is potted in the electrically insulating compound, this provides the advantage that the electrically insulating compound can be applied particularly easily, the electrically insulating compound advantageously filling intermediate spaces in the electronics assembly and it being possible for the electrical and/or electronic components of the electronics assembly, the substrate upper side and interconnects arranged on the substrate upper side to be covered from all exposed sides, and thereby to be advantageously insulated well. This also allows for example an advantageous material-bonding connection to be established between the terminal contacts and the electrically insulating compound, air bubbles and voids in the electrically insulating compound to be avoided, and consequently for example creepage currents also to be advantageously avoided. At the same time, the electronics unit can be advantageously protected well from external effects.

BRIEF DESCRIPTION OF THE DRAWINGS

An exemplary embodiment of the invention is explained in more detail in the description that follows and is represented in the drawing, in which.

DETAILED DESCRIPTION

The electronic circuit unit according to the invention may have a wide variety of applications, for example as an inverter or a converter in automotive engineering. For example, the electronic circuit unit may also be used as an inverter referred to as a power inverter for the operation of an electrical machine, for example of hybrid or electric vehicles.

Figure 1:
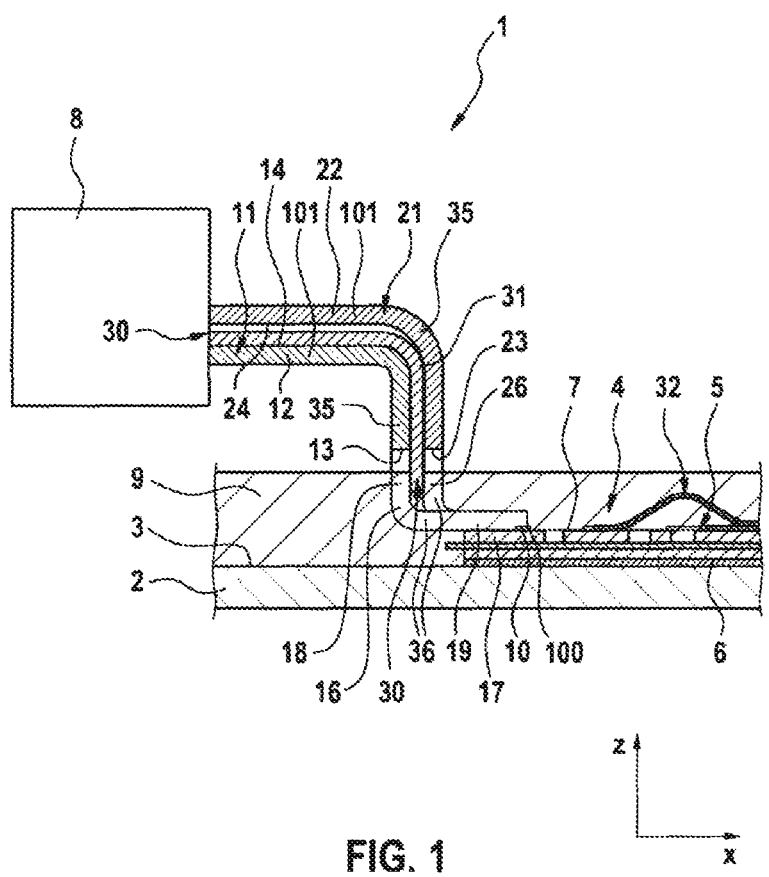
FIG. 1 shows a schematic cross section through an exemplary embodiment of the electronic circuit unit according to the invention.
Figure 2:
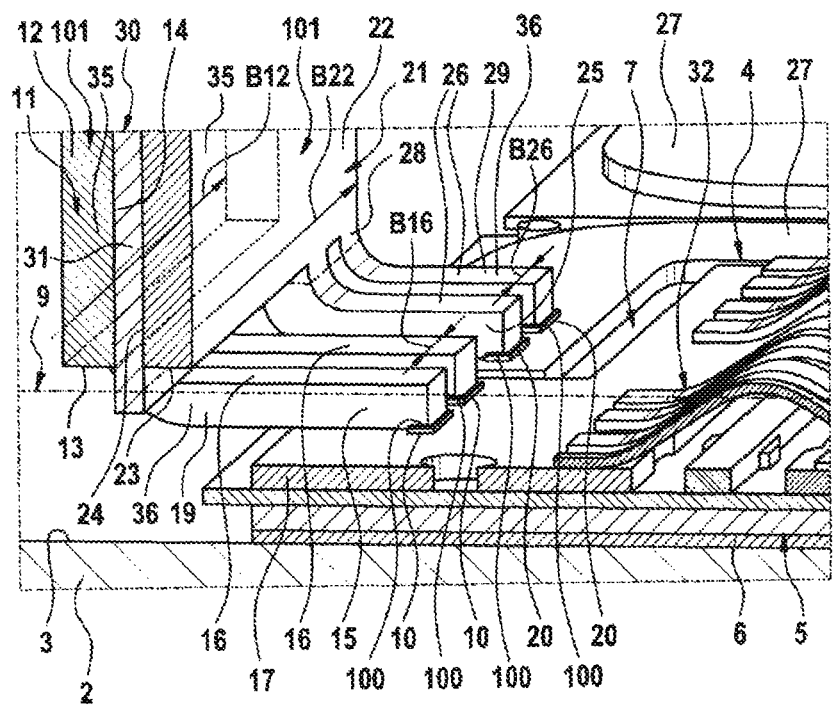
FIG. 2 shows a schematic cross section through a three-dimensional cutout of the exemplary embodiment of the electronic circuit unit according to the invention.
Figure 2:
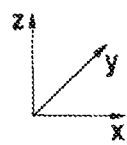
Figure 3:
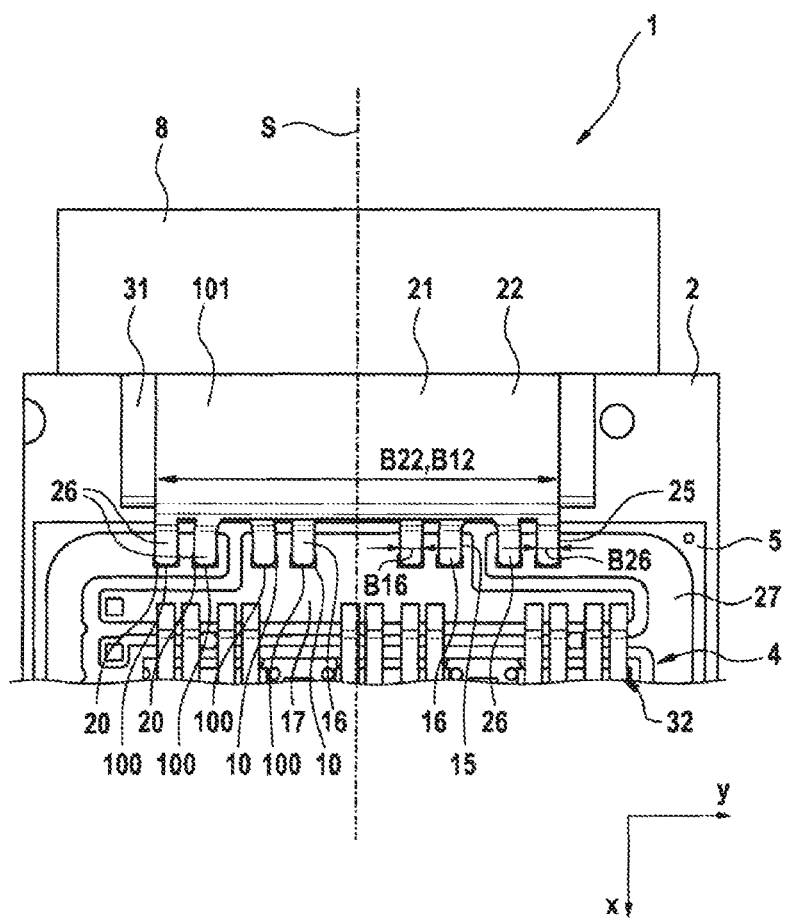
FIG. 3 shows a plan view of the exemplary embodiment of the electronic circuit unit according to the invention.

Various views and forms of representation of an exemplary embodiment of the electronic circuit unit according to the invention are represented in FIG. 1 to FIG. 3. In the figures, axes of a system of Cartesian coordinates are additionally represented in order to identify directions in the representations of the exemplary embodiment.

FIG. 1 shows a schematic cross section through an exemplary embodiment of the electronic circuit unit according to the invention. The circuit unit comprises an electronics unit 4, in particular a power electronics unit, the electronics unit 4 comprising a carrier substrate 5 and electrical and/or electronic components 32 that are arranged on the carrier substrate 5. The carrier substrate 5 may comprise a number of layers of electrically conductive materials such as metals and/or dielectric materials. The carrier substrate 5 is for example a leadframe, in this exemplary embodiment a DBC substrate (Direct Bonded Copper). The carrier substrate 5 may however also be for example an AMB substrate (Active Metal Brazed), an IMS (Insulated Metal Substrate), a printed circuit board (PCB) or some other substrate that is suitable for power modules. On a substrate upper side 7 of the carrier substrate 5 there may be arranged various electrical and/or electronic components 32, such as for example power semiconductors, such as for example field-effect transistors such as MIS-FETs (Metal Insulated Semiconductor Field Effect Transistors), IGBTs (insulated-gate bipolar transistors), power MOSFETs (metal oxide semiconductor field-effect transistors) and/or diodes, for example rectifier diodes. They may be for example unpackaged power semiconductors (bare dies). Furthermore, passive components, such as for example resistors and capacitors, may also be arranged on the carrier substrate 5 as electrical and/or electronic components 32. The carrier substrate 5 may also comprise interconnects 17, 27. The electrical and/or electronic components 32 may be connected in an electrically conducting manner to one another or to further electrical and/or electronic elements that are arranged outside the electronics unit 4 and are not represented in the figures, for example by way of the interconnects 17, 27 of the carrier substrate 5, by way of bonding wires or other suitable electrically conducting contact elements, for example by soldering or sintering. The interconnects 17, 27 may be formed as in this exemplary embodiment as conductor areas. On the substrate upper side 7 of the carrier substrate 5 there is arranged at least one terminal pad 100. In the exemplary embodiment represented in FIG. 1 to FIG. 3, a number of terminal pads are formed on the substrate upper side 7. For example, first terminal pads 10 of the carrier substrate 5 are formed on a first interconnect 17 and, for example, second terminal pads 20 of the carrier substrate 5 are formed on a second interconnect 27. By way of these terminal pads 100, the electronics unit 4 can be connected in an electrically conducting manner to elements arranged outside the electronics unit 4. As represented in FIG. 3, in this exemplary embodiment four first terminal pads 10 are formed on the first interconnect 17 of the carrier substrate 5 and four second terminal pads 20 are formed on the second interconnect 27 of the carrier substrate 5.

In this exemplary embodiment, the carrier substrate 5 of the electronics unit 4 is arranged on an upper side 3 of a heat sink 2 and is for example soldered onto the upper side 3 of the heat sink 2. The carrier substrate 5 may rest on the heat sink 2 directly or else, as in this exemplary embodiment, with a heat conducting layer 6 interposed. The heat sink 2 serves for dissipating heat that is generated in the electronics unit 4 and is distinguished by high thermal conductivity. The heat sink 2 is produced from a material with good thermal conductivity, such as for example aluminum or copper. In this exemplary embodiment, the heat sink 2 is produced from copper and is formed as a plate. On the heat sink 2 there may also be formed for example structures that are not represented in the figures for improving the heat dissipation, such as for example ribs, pins or channels. The carrier substrate 5 of the electronics unit 4 may for example also rest directly on the upper side 3 of the heat sink 2 and for example be insulated from the heat sink 2 by an electrically insulating layer that is comprised by the carrier substrate 5.

Furthermore, as represented in FIG. 1, the electronic circuit unit 1 comprises at least one electrical and/or electronic device 8, which is not comprised by the electronics unit 4. In the exemplary embodiment described in the present application, the electrical and/or electronic device 8 is a capacitor. It may for example be a power capacitor, which serves for example as a DC link capacitor of the electronic circuit unit 1. Such a capacitor may also include a number of capacitor elements that are connected in an electrically conducting manner to one another, themselves form individual capacitances and for example also comprise the electrically conducting connecting elements that are necessary for the electrically conducting connection of these capacitor elements. Various capacitor technologies, such as for example film capacitors, such as stacked or cylindrically wound capacitors, or other suitable capacitor technologies may be used here as the capacitor or as the capacitor elements.

In the exemplary embodiment, the capacitor comprises as an electrical and/or electronic device 8 two terminal contacts 101. In the context of the present application, a terminal contact 101 of the electrical and/or electronic device 8 is understood as meaning an electrically conductive and one-piece component that extends or protrudes from the electrical and/or electronic device 8 and is intended for the electrical contacting of the electrical and/or electronic device 8 with electrical and/or electronic elements arranged outside the electrical and/or electronic device 8. Thus, in this exemplary embodiment two terminal contacts 101 protrude from the capacitor as an electrical and/or electronic device 8 and are intended for the electrical contacting of the two electrodes of the capacitor 8 with electrical and/or electronic elements arranged outside the capacitor 8, such as in particular of the electronics unit 4. The terminal contacts 101 may be at least partially produced from one or more metals, such as for instance copper or aluminum, and for example be partially insulated or else not insulated. They may for example be produced from metal sheets. In the present application, a distinction is drawn between a first terminal contact 11 and a second terminal contact 21, the first terminal contact 11 representing a terminal contact 101 which, as in the exemplary embodiment with a capacitor as the electrical and/or electronic device 8, extends from a first of the two electrodes and the second terminal contact 21 representing a terminal contact 101 which extends from a second of the two electrodes of the capacitor. In the figures, two terminal contacts 101, a first terminal contact 11 and a second terminal contact 21, are represented by way of example. However, a number of first and/or second terminal contacts 21 may also be formed, and for example also be connected in an electrically conducting manner to further terminal pads 100 that are formed on further electronics units 4 not represented in the figures. Furthermore, the electrical and/or electronic device 8 may for example also be connected in electrically conducting manner to other elements not represented in the figures, such as for example further electrical and/or electronic devices 8, by way of other electrical contacts not represented in the figures.

The first terminal contact 11 of the electrical and/or electronic device 8 is connected in an electrically conducting manner to the first terminal pads 10 and the second terminal contact 21 of the electrical and/or electronic device 8 is connected in electrically conducting manner to the second terminal pads 20. A terminal contact 101 may for example be welded to terminal pads 100, and consequently be connected both in an electrically conducting manner and in a mechanical manner thereto. Terminal contacts 101 may however also be connected in an electrically conducting manner to terminal pads 100 for example by soldering, press contacts, press-fit contacts, purely pressure contacts or else by other suitable contacting techniques. In the exemplary embodiment, the first terminal contact 11 of the capacitor is connected in an electrically conducting manner as an electrical and/or electronic device 8 to the four first terminal pads 10 of the first interconnect 17 of the carrier substrate 5, the second terminal contact 21 of the capacitor is connected in an electrically conducting manner to the four second terminal pads 20 of the second interconnect 27.

As represented in FIG. 1, in this exemplary embodiment of the electronic circuit unit 1 the first terminal contact 11 is formed partially two-dimensionally as a first conductor bar 12 and the second terminal contact 21 is formed partially as a two-dimensional second conductor bar 22. In this case, the first terminal contact 11 and the second terminal contact 21 are arranged in relation to one another in such a way that a first large area 14 of the first conductor bar 12 lies opposite a second large area 24 of the second conductor bar 22, so that at least a gap 30 is formed between the first conductor bar 12 and the second conductor bar 22. In the context of the present application, a conductor bar 12, 22 is understood as meaning an electrically conducting two-dimensional conductor, for example an electrically conducting bar or an electrically conducting strip, which forms at least part of a terminal contact 101. A conductor bar 12, 22 may consequently be for example a busbar. The conductor bars 12, 22 may for example be bent or curved or else run in a curve- or step-like manner. Large areas 14, 24 of the conductor bars 12, 22 are understood in the context of the present application as meaning planar or curved areas that are formed on the conductor bars 12, 22 and are at least partially bounded by an edge 13, 23 of the conductor bar 12, 22.

The conductor bars 12, 22 may in this case largely overlap and for example also be led such that they are at least partially plane-parallel to one another, in order to make it possible for the current to be conducted with as low an inductance as possible. The conductor bars 12, 22 may for this purpose preferably also be led such that at least in regions they are parallel to one another and for example also be of the same width. As represented in FIG. 3, in this exemplary embodiment a width B12 of the first conductor bar 12 corresponds to a width B22 of the second conductor bar 22. In the exemplary embodiment represented in FIG. 1, the first conductor bar 12 of the first terminal contact 11 and the second conductor bar 22 of the second terminal contact 21 are arranged partially perpendicularly to the carrier substrate 5.

The first terminal contact 11 may be at least partially kept at a distance from the second terminal contact 21 by a gap 30 and not be in direct contact with the second terminal contact 21. In this exemplary embodiment, arranged in the gap 30 between the first conductor bar 12 and the second conductor bar 22 is an insulating element 31, which electrically insulates the first conductor bar 12 from the second conductor bar 22. The insulating element 31 may for example be two-dimensionally formed and be for example a paper or a film of electrically insulating material, for example electrically insulating plastic. The insulating element 31 may also protrude beyond the gap 30 between the first conductor bar 12 and the second conductor bar 22, that is to say for example also protrude beyond the edges of the conductor bars 12, 22, and may also electrically insulate the terminal contacts 11, 21 from one another in the regions of the terminal contacts 11, 21 that are not formed as conductor bars 12, 22, or in regions in which the large areas 14, 24 of the conductor bars 12, 22 do not lie opposite. The insulating element 31 at least partially arranged in the gap 30 may for example also be adhesively attached in a material-bonding manner to the first large area 14 of the first conductor bar 12 and/or to the second large area 24 of the second conductor bar 22. Thus, the insulating element 31 may for example also form a laminate with the first terminal contact 11 and/or with the second terminal contact 21.

As represented in FIG. 2, in the electronic circuit unit 1 at least one first terminal web 16 may be formed on the first conductor bar 12 and at least one second terminal web 26 may be formed on the second conductor bar 22. In this exemplary embodiment, four terminal webs 16, 26 are respectively formed on the conductor bars 12, 22. In this exemplary embodiment, the terminal webs 16, 26 are formed on the edges 13, 23 of the conductor bars 12, 22 as lateral continuations of the conductor bars 12, 22. In this exemplary embodiment, as represented in FIG. 3, four first terminal webs 16 are formed on the first conductor bar 12 and four second terminal webs 26 are formed on the second conductor bar 22. The electrically conducting connection between the first terminal contact 11 and the first terminal pads 10 is in this case established by way of the first terminal webs 16 and the electrically conducting connection between the second terminal contact 21 and the second terminal pads 20 is established by way of the second terminal webs 26. In this exemplary embodiment, the terminal webs 16, 26 are welded to the respective terminal pads 10, 20, and consequently are connected in an electrically conducting and mechanical manner thereto. The terminal webs 16, 26 may however also be connected in an electrically conducting manner to the respective terminal pads 10, 20 for example by soldering, a press contact, a press-fit contact, a purely pressure contact or other suitable contacting techniques. In this exemplary embodiment, a width B16 of each first terminal web 16 is less than a width B12 of the first conductor bar 12. Equally, a width B26 of each second terminal web 26 is less than a width B22 of the second conductor bar 22. In the exemplary embodiment represented, the widths B12, B16, B22 and B26 are measured in they direction. In this exemplary embodiment, the width B12 and the width B16, which belong to the first terminal contact 11, are thereby measured in the same direction. In the exemplary embodiment, the width B22 and the width B26, which belong to the second terminal contact 21, are also measured in the same direction. In the context of the present application, a width of a conductor bar 12, 22 or of a terminal web 16, 26 is generally a width that is measured perpendicularly to an edge 13, 23 of the conductor bar 12, 22 or to an edge 15, 25 of the terminal web 16, 26 and transversely to a direction of current flow through the conductor bar 12, 22 or to a direction of current flow through the terminal web 16, 26.

As represented in FIG. 1 and in FIG. 2, in the exemplary embodiment of the electronic circuit unit 1 the first terminal webs 16 of the first terminal contact 11 and the second terminal webs 26 of the second terminal contact 21 have L-shaped profiles. As in this exemplary embodiment, first regions 18 of the first terminal webs 16 may in this case be formed in a plane of extent of the first conductor bar 12 and second regions 19 of the first terminal webs 16 may be arranged parallel to the carrier substrate 5. Equally, first regions 28 of the second terminal webs 26 may be formed in a plane of extent of the second conductor bar 22 and second regions 29 of the second terminal webs 26 may be arranged parallel to the carrier substrate 5. The terminal webs 16, 26 may therefore be formed for example as lateral continuations of the conductor bars 12, 22 in planes of extent of the conductor bars 12, 22 and subsequently for example be bent out from these planes of extent, so that their first regions 18, 28 remain in the planes of extent and their second regions 19, 29 are aligned parallel to the carrier substrate 5. The terminal webs 16, 26 may for example be formed on edges 15, 25 of the conductor bars 12, 22 and adjoin the conductor bars 12, 22 in lateral continuation.

As represented in FIG. 3, in the exemplary embodiment the first terminal contact 11 and the second terminal contact 21 are formed symmetrically with respect to a plane of symmetry S running perpendicularly to the carrier substrate 5. It may however also be that only the first terminal contact 11 or the second terminal contact 21 is formed symmetrically with respect to the plane of symmetry S. As illustrated on the basis of the exemplary embodiment and represented in FIG. 3, the plane of symmetry S may for example run perpendicularly to the carrier substrate 5. It may also be additionally arranged perpendicularly to at least one of the terminal contacts 11, 21 and, for example with conductor bars 12, 22 arranged at least partially perpendicularly to the carrier substrate 5, also be perpendicular to the part of the conductor bars 12, 22 that is perpendicular to the carrier substrate 5. This is the case in the exemplary embodiment that is represented in the present application. Consequently, in this exemplary embodiment the carrier substrate 5 may also be at least partially symmetrically designed, and consequently the overall inductance of the electronic circuit unit 1 can in this way be advantageously reduced.

In this exemplary embodiment, the electronics unit 4 is completely surrounded by an electrically insulating compound 9 on the upper side 3 of the heat sink 2. In this case, the first terminal contact 11 and the first terminal pads 10 and the second terminal contact 21 and the second terminal pads 20 are surrounded by the electrically insulating compound 9 in the region of their points of electrical contact. The electronics unit 4 may for example be arranged, along with further electronics units, in a rack which is placed on the upper side 3 of the heat sink 2 and is not represented in the figures and which is filled with the electrically insulating compound 9, so that the entire electronics unit 4 is surrounded by the electrically insulating compound 9. As represented in the exemplary embodiment, the electrical and/or electronic device 8, in this exemplary embodiment the capacitor, is arranged outside the electrically insulating compound 9 and the terminal contacts 11, 21 of the capacitor 8 are led into the electrically insulating compound 9. Consequently, in the exemplary embodiment the first terminal contact 11 and the first terminal pad 10 and the second terminal contact 21 and the second terminal pad 20 are also surrounded by an electrically insulating compound 9 in the region of the point of electrical contact. If the electronics unit is completely surrounded by the electrically insulating compound 9, the electrical and/or electronic components 32 of the electronics unit 4 are electrically insulated from one another and from other electrically conducting parts of the electronic circuit unit 1, and the electrically insulating compound 9 can also be adhesively attached in a material-bonding manner to the carrier substrate 5, the interconnects 17, 27 and/or the electrical and/or electronic components 32.

In this exemplary embodiment, the terminal contacts 101 of the electrical or electronic device 8 are led into the electrically insulating compound 9. Thus, first regions 35 of the terminal contacts 101, which are facing the electrical or electronic device 8, are arranged outside the electrically insulating compound 9 and second regions 36 of the terminal contacts 101, in which the terminal contacts 101 are in electrically conducting contact with the terminal pads 100, are arranged inside the electrically insulating compound 9. In this exemplary embodiment, the electrically insulating compound 9 is formed as a potting compound and the electronics unit 4 is potted in the electrically insulating compound 9. The potting compound may for example be silicone gel, epoxy resin and/or a transfer molding compound.

As in the exemplary embodiment, the insulating element 31 may be led together with the first terminal contact 11 and the second terminal contact 21 into the electrically insulating compound 9. Thus, a continuous insulation of the terminal contacts 11, 21 from one another up to in the electrically insulating compound 9 can be ensured.

The electrically insulating compound 9 may for example surround the components of the electronics unit 4, such as for example semiconductor switches or diodes, and/or for example also the interconnects 17, 27 of the carrier substrate 5 such that they are electrically insulated from one another and from a surrounding vicinity, and for example also seal them in an airtight manner. Furthermore, the electrically insulating compound 9 may advantageously be thermally conducting in order to dissipate effectively the heat that is generated by the electrical and/or electronic components 32. The electrically insulating compound 9 is preferably formed as a molding compound, for instance as a plastics compound, which is poured or injected in a molding process, in particular in an in-mold process, onto the electrical and/or electronic components 32, for example semiconductor switches or diodes, and the interconnects 17, 27, which have already been correspondingly arranged in relation to one another and electrically connected. The electrically insulating compound 9 may also be a passivation gel, for example a silicone gel. The electrically insulating compound 9 can consequently on the one hand electrically insulate the electronics unit 4 and at the same time also stabilize it and protect the electrical and/or electronic components 32 that are for example embedded in it, such as for instance power semiconductors and diodes, or the interconnects 17, 27 of the carrier substrate 5 from external effects. The electrically insulating compound 9 may for example also be a flowable and liquid substance, which solidifies by a curing process. It may therefore be for example a polymeric protective system, and for example also be applied by encapsulation or potting. For example, it may also be a thermoset, such as for example an epoxy resin.

It goes without saying that further exemplary embodiments and mixed forms of the exemplary embodiments represented are also possible.

What is claimed is:

1. An electronic circuit unit (1), comprising at least one electronics unit (4), the electronics unit (4) comprising at least one carrier substrate (5) and at least one electrical and/or electronic component (32) arranged on the carrier substrate (5), the carrier substrate (5) being arranged on an upper side (3) of a heat sink (2) and at least one terminal pad (100) being formed on the carrier substrate (5), on a substrate upper side (7) of the carrier substrate (5) that is facing away from the upper side (3) of the heat sink (2), the electronic circuit unit (1) also comprising at least one electrical or electronic device (8) with at least one terminal contact (101), the at least one terminal contact (101) being connected in an electrically conducting manner to the at least one terminal pad (100), wherein the at least one terminal contact (101) and the at least one terminal pad (100) are surrounded in a region of an electrical point of contact by an electrically insulating compound (9), the electrical or electronic device (8) being spaced from the electrically insulating compound (9), and wherein the electronics unit (4) is completely surrounded by the electrically insulating compound (9) on the upper side (3) of the heat sink (2) and the at least one terminal contact (101) of the electrical or electronic device (8) is led into the electrically insulating compound (9), so that a first region (35) of the terminal contact (101), which is directly connected to the electrical or electronic device (8), is arranged outside the electrically insulating compound (9) and a second region (36) of the terminal contact (101), in which the terminal contact (101) is in electrically conducting contact with the terminal pad (100), is arranged inside the electrically insulating compound (9).

2. The electronic circuit unit according to claim 1, characterized in that the at least one terminal contact and an additional terminal contact (101), comprising at a first terminal contact (11) and a second terminal contact (21), are formed on the electrical or electronic device (8) and the at least one terminal pad and an additional terminal pad (100), comprising a first terminal pad (10) and a second terminal pad (20), are formed on the substrate upper side (7) of the carrier substrate (5), the first terminal contact (11) being formed at least partially two-dimensionally as a first conductor bar (12) and the second terminal contact (21) being formed at least partially as a two-dimensional second conductor bar (22), and the first terminal contact (11) and the second terminal contact (21) being arranged in relation to one another in such a way that a first large area (14) of the first conductor bar (12) lies opposite a second large area (24) of the second conductor bar (22), so that at least a gap (30) is formed between the first conductor bar (12) the second conductor bar (22).

3. The electronic circuit unit according to claim 2, characterized in that an insulating element (31), which electrically insulates the first conductor bar (12) from the second conductor bar (22), is arranged in the gap (30) between the first conductor bar (12) and the second conductor bar (22), the insulating element (31) being two-dimensionally formed and led together with the first terminal contact (11) and the second terminal contact (21) into the electrically insulating compound (9).

4. The electronic circuit unit according to claim 3, characterized in that the insulating element (31) arranged in the gap (30) is adhesively attached in a material-bonding manner to the first large area (14) of the first conductor bar (11) and/or to the second large area (24) of the second conductor bar (21).

5. The electronic circuit unit according to claim 2, characterized in that the first conductor bar (12) of the first terminal contact (11) and the second conductor bar (22) of the second terminal contact (21) are arranged at least in certain regions perpendicularly to the carrier substrate (5).

6. The electronic circuit unit according to claim 2, characterized in that at least one first terminal web (16) is formed on the first conductor bar (12) and at least one second terminal web (26) is formed on the second conductor bar (22), the electrically conducting connection between the first terminal contact (11) and first terminal pad (10) being established by way of the first terminal web (16) and the electrically conducting connection between the second terminal contact (21) and the second terminal pad (20) being established by way of the second terminal web (26), a width (B16) of the first terminal web (16) being less than a width (B12) of the first conductor bar (12) and a width (B26) of the second terminal web (26) being less than a width (B22) of the second conductor bar (22).

7. The electronic circuit unit according to claim 6, characterized in that the first terminal web (16) of the first terminal contact (11) and/or the second terminal web (26) of the second terminal contact (21) have an L-shaped profile, a first region (18) of the first terminal web (16) being formed in a plane of extent of the first conductor bar (12) and a second region (19) of the first terminal web (16) being arranged parallel to the carrier substrate (5) and/or a first region (28) of the second terminal web (26) being formed in a plane of extent of the second conductor bar (22) and a second region (29) of the second terminal web (26) being arranged parallel to the carrier substrate (5).

8. The electronic circuit unit according to claim 2, characterized in that the first terminal contact (11) and/or the second terminal contact (21) are formed symmetrically with respect to a plane of symmetry (S) running perpendicularly to the carrier substrate (5).

9. The electronic circuit unit according to claim 2, characterized in that the first terminal contact (11) is welded to the first terminal pad (10) and/or the second terminal contact (21) is welded to the second terminal pad (20).

10. The electronic circuit unit according to claim 1, characterized in that the electrically insulating compound (9) is formed as a potting compound and the electronics unit (4) is potted in the electrically insulating compound (9).

11. The electronic circuit unit according to claim 1, characterized in that the electrical or electronic device is a capacitor.

12. An electronic circuit unit (1), comprising:
at least one electronics unit (4), the electronics unit (4) comprising:
at least one carrier substrate (5), and
at least one electrical and/or electronic component (32) arranged on the carrier substrate (5), the carrier substrate (5) being arranged on an upper side (3) of a heat sink (2) and at least one terminal pad (100) being formed on the carrier substrate (5), on a substrate upper side (7) of the carrier substrate (5) that is facing away from the upper side (3) of the heat sink (2), and
at least one electrical or electronic device (8) with at least one terminal contact (101), the at least one terminal contact (101) being connected in an electrically conducting manner to the at least one terminal pad (100), wherein the at least one terminal contact (101) and the at least one terminal pad (100) are surrounded in a region of an electrical point of contact by an electrically insulating compound (9), the electrical or electronic device (8) being spaced from the electrically insulating compound (9),
wherein the at least one terminal contact and an additional terminal contact (101), comprising at a first terminal contact (11) and a second terminal contact (21), are formed on the electrical or electronic device (8) and the at least one terminal pad and an additional terminal pad (100), comprising a first terminal pad (10) and a second terminal pad (20), are formed on the substrate upper side (7) of the carrier substrate (5), the first terminal contact (11) being formed at least partially two-dimensionally as a first conductor bar (12) and the second terminal contact (21) being formed at least partially as a two-dimensional second conductor bar (22), and the first terminal contact (11) and the second terminal contact (21) being arranged in relation to one another in such a way that a first large area (14) of the first conductor bar (12) lies opposite a second large area (24) of the second conductor bar (22), so that at least a gap (30) is formed between the first conductor bar (12) the second conductor bar (22), and wherein an insulating element (31), which electrically insulates the first conductor bar (12) from the second conductor bar (22), is arranged in the gap (30) between the first conductor bar (12) and the second conductor bar (22), the insulating element (31) being two-dimensionally formed and led together with the first terminal contact (11) and the second terminal contact (21) into the electrically insulating compound (9).

13. The electronic circuit unit according to claim 12, characterized in that the insulating element (31) arranged in the gap (30) is adhesively attached in a material-bonding manner to the first large area (14) of the first conductor bar (11) and/or to the second large area (24) of the second conductor bar (21).

14. An electronic circuit unit (1), comprising:
at least one electronics unit (4), the electronics unit (4) comprising:
at least one carrier substrate (5), and
at least one electrical and/or electronic component (32) arranged on the carrier substrate (5), the carrier substrate (5) being arranged on an upper side (3) of a heat sink (2) and at least one terminal pad (100) being formed on the carrier substrate (5), on a substrate upper side (7) of the carrier substrate (5) that is facing away from the upper side (3) of the heat sink (2), and
at least one electrical or electronic device (8) with at least one terminal contact (101), the at least one terminal contact (101) being connected in an electrically conducting manner to the at least one terminal pad (100), wherein the at least one terminal contact (101) and the at least one terminal pad (100) are surrounded in a region of an electrical point of contact by an electrically insulating compound (9), the electrical or electronic device (8) being spaced from the electrically insulating compound (9),
wherein the at least one terminal contact and an additional terminal contact (101), comprising at a first terminal contact (11) and a second terminal contact (21), are formed on the electrical or electronic device (8) and the at least one terminal pad and an additional terminal pad (100), comprising a first terminal pad (10) and a second terminal pad (20), are formed on the substrate upper side (7) of the carrier substrate (5), the first terminal contact (11) being formed at least partially two-dimensionally as a first conductor bar (12) and the second terminal contact (21) being formed at least partially as a two-dimensional second conductor bar (22), and the first terminal contact (11) and the second terminal contact (21) being arranged in relation to one another in such a way that a first large area (14) of the first conductor bar (12) lies opposite a second large area (24) of the second conductor bar (22), so that at least a gap (30) is formed between the first conductor bar (12) the second conductor bar (22), and
wherein that at least one first terminal web (16) is formed on the first conductor bar (12) and at least one second terminal web (26) is formed on the second conductor bar (22), the electrically conducting connection between the first terminal contact (11) and first terminal pad (10) being established by way of the first terminal web (16) and the electrically conducting connection between the second terminal contact (21) and the second terminal pad (20) being established by way of the second terminal web (26), a width (B 16) of the first terminal web (16) being less than a width (B12) of the first conductor bar (12) and a width (B26) of the second terminal web (26) being less than a width (B22) of the second conductor bar (22).

15. The electronic circuit unit according to claim 14, characterized in that the first terminal web (16) of the first terminal contact (11) and/or the second terminal web (26) of the second terminal contact (21) have an L-shaped profile, a first region (18) of the first terminal web (16) being formed in a plane of extent of the first conductor bar (12) and a second region (19) of the first terminal web (16) being arranged parallel to the carrier substrate (5) and/or a first region (28) of the second terminal web (26) being formed in a plane of extent of the second conductor bar (22) and a second region (29) of the second terminal web (26) being arranged parallel to the carrier substrate (5).

* * * * *